(12) United States Patent
Shibazaki et al.

(10) Patent No.: US 8,358,401 B2
(45) Date of Patent: Jan. 22, 2013

(54) STAGE APPARATUS, EXPOSURE APPARATUS AND DEVICE MANUFACTURING METHOD

(75) Inventors: Yuichi Shibazaki, Kumagaya (JP); Hiromitsu Yoshimoto, Saitama (JP)

(73) Assignee: Nikon Corporation, Tokyo (JP)

( * ) Notice: Subject to any disclaimer, the term of this patent is extended or adjusted under 35 U.S.C. 154(b) by 527 days.

(21) Appl. No.: 12/385,577

(22) Filed: Apr. 13, 2009

(65) Prior Publication Data

US 2010/0073661 A1  Mar. 25, 2010

Related U.S. Application Data

(60) Provisional application No. 61/071,303, filed on Apr. 21, 2008.

(30) Foreign Application Priority Data

Apr. 11, 2008  (JP) ................................ 2008-103737

(51) Int. Cl.
*G03B 27/62* (2006.01)
*G03B 27/58* (2006.01)
*G03B 27/68* (2006.01)
*G03B 27/42* (2006.01)

(52) U.S. Cl. ................. 355/75; 355/52; 355/53; 355/72
(58) Field of Classification Search ............. 355/52, 355/53, 55, 72–76, 77, 78, 91–95; 430/5, 430/30, 311; 378/34, 35
See application file for complete search history.

(56) References Cited

U.S. PATENT DOCUMENTS

| 4,391,511 | A |   | 7/1983  | Akiyama et al.         |
|-----------|---|---|---------|------------------------|
| 4,666,291 | A | * | 5/1987  | Taniguchi et al. ........ 355/52 |
| 5,485,495 | A | * | 1/1996  | Miyachi et al. .......... 378/34 |
| 5,534,969 | A | * | 7/1996  | Miyake ................... 355/53 |
| 5,563,684 | A | * | 10/1996 | Stagaman .............. 355/72 |
| 5,854,819 | A | * | 12/1998 | Hara et al. ............... 378/34 |
| 6,069,931 | A | * | 5/2000  | Miyachi et al. .......... 378/34 |
| 6,084,244 | A | * | 7/2000  | Saiki et al. ............. 250/548 |
| 6,208,407 | B1 |  | 3/2001  | Loopstra |
| 6,262,796 | B1 |  | 7/2001  | Loopstra et al. |
| 6,341,007 | B1 |  | 1/2002  | Nishi et al. |
| 6,400,441 | B1 |  | 6/2002  | Nishi et al. |
| 6,549,269 | B1 |  | 4/2003  | Nishi et al. |
| 6,590,634 | B1 |  | 7/2003  | Nishi et al. |
| 6,611,316 | B2 |  | 8/2003  | Sewell |
| 6,778,257 | B2 |  | 8/2004  | Bleeker et al. |
| 6,881,963 | B2 | * | 4/2005  | Ito ...................... 250/491.1 |

(Continued)

FOREIGN PATENT DOCUMENTS

EP  1 713 113 A1  10/2006
JP  A-57-034336   2/1982

(Continued)

OTHER PUBLICATIONS

Written Opinion of corresponding International Patent Application No. PCT/JP2009/057433, mailed on May 12, 2009 (w/ English translation).

(Continued)

*Primary Examiner* — Toan Ton
*Assistant Examiner* — Christina Riddle
(74) *Attorney, Agent, or Firm* — Oliff & Berridge, PLC

(57) ABSTRACT

An exposure apparatus comprises a stage main body having a mounting surface, and a correcting mechanism that corrects a shape of the mounting surface.

19 Claims, 8 Drawing Sheets

U.S. PATENT DOCUMENTS

| | | | |
|---|---|---|---|
| 6,897,963 B1 | 5/2005 | Taniguchi et al. | |
| 7,023,610 B2 | 4/2006 | Ohtsuki et al. | |
| 2003/0016338 A1* | 1/2003 | Yasuda et al. | 355/55 |
| 2003/0179354 A1* | 9/2003 | Araki et al. | 355/53 |
| 2004/0013956 A1* | 1/2004 | Sogard | 430/30 |
| 2005/0237510 A1* | 10/2005 | Shibazaki | 355/72 |
| 2005/0248744 A1 | 11/2005 | Shibazaki | |

FOREIGN PATENT DOCUMENTS

| | | |
|---|---|---|
| JP | A-61-292918 | 12/1986 |
| JP | A-63-209126 | 8/1988 |
| JP | A-2006-80281 | 3/2006 |
| JP | A-2007-184328 | 7/2007 |
| JP | A-2007-242826 | 9/2007 |
| WO | WO 99/49504 | 9/1999 |

OTHER PUBLICATIONS

International Search Report in International Application No. PCT/JP2009/057433, dated May 12, 2009 (with English translation).

* cited by examiner

STAGE APPARATUS, EXPOSURE APPARATUS AND DEVICE MANUFACTURING METHOD

CROSS-REFERENCE TO RELATED APPLICATION

This application is a non-provisional application claiming priority to and the benefit of U.S. provisional application No. 61/071,303, filed Apr. 21, 2008, and claims priority to Japanese Patent Application No. 2008-103737, filed Apr. 11, 2008. The entire contents of which are incorporated herein by reference.

BACKGROUND

1. Field of the Invention

The present invention relates to a stage apparatus, an exposure apparatus, and device manufacturing method.

2. Description of Related Art

Exposure apparatuses used in photolithographic processes expose a substrate by illuminating a mask with exposure light and exposing the substrate with the exposure light that passes through the mask. Such an exposure apparatus comprises a mask stage, which holds and moves the mask, and a substrate stage, which holds and moves the substrate, as disclosed in, for example, U.S. Patent Application Publication No. 2005/0248744. A technique is known in the art wherein the mask stage holds the mask by, for example, chucking the mask to a mounting surface of the mask stage.

Notwithstanding the above, holding the mask on the mounting surface via, for example, chucking risks deforming the mask, which in turn warps the shape of the mask. Warpage in the shape of the mask will lead to distortion in the pattern of the mask. If an exposure is formed in the state wherein the distortion of the pattern is left as is, then exposure failures, such as a reduction in the overlay accuracy of the pattern on the substrate or a defect in the pattern formed on the substrate, might occur. These potential problems could also result in the production of defective devices. There is a significant possibility that exposure failures and defective devices will occur not only because of the warpage of the mask but also because of warpage in the shape of an object mounted on the mounting surface, such as the substrate on the substrate stage.

A purpose of an aspect of the present invention is to provide a stage apparatus that can correct warpage in the shape of a surface that contacts a mounting surface and an exposure apparatus that can prevent exposure failures from occurring.

SUMMARY

A stage apparatus according to an aspect of the present invention comprises: a stage main body, which is moveably provided and has a mounting surface; and a correcting mechanism, which corrects a shape of the mounting surface.

According to the abovementioned configuration, the correcting mechanism can correct the shape of the mounting surface, and therefore the shape of the surface that contacts the mounting surface can be deformed to a desired shape by the mounting surface, whose shape has been corrected. Thereby, the warpage in the shape of the surface that contacts the mounting surface can be corrected.

In addition, an exposure apparatus according to an aspect of the present invention comprises the abovementioned stage apparatus.

The abovementioned configuration comprises a stage apparatus capable of correcting warpage in the shape of the mounting surface, which makes it possible to prevent exposure failures from occurring owing to warpage of the shape of the surface that contacts the mounting surface.

According to some aspects of the present invention, it is possible to correct warpage in the shape of a surface that contacts a mounting surface and to prevent exposure failures from occurring.

DESCRIPTION OF EMBODIMENTS

The following text explains the embodiments of the present invention referencing the drawings, but the present invention is not limited thereto. The explanation below defines an XYZ orthogonal coordinate system, and the positional relationships among members are explained referencing this system. Prescribed directions within the horizontal plane are the X axial directions, directions orthogonal to the X axial directions in the horizontal plane are the Y axial directions, and directions orthogonal to the X axial directions and the Y axial directions (i.e., the vertical directions) are the Z axial directions. In addition, the rotational (i.e., inclinational) directions around the X, Y, and Z axes are the θX, θY, and θZ directions, respectively.

Figure 1:
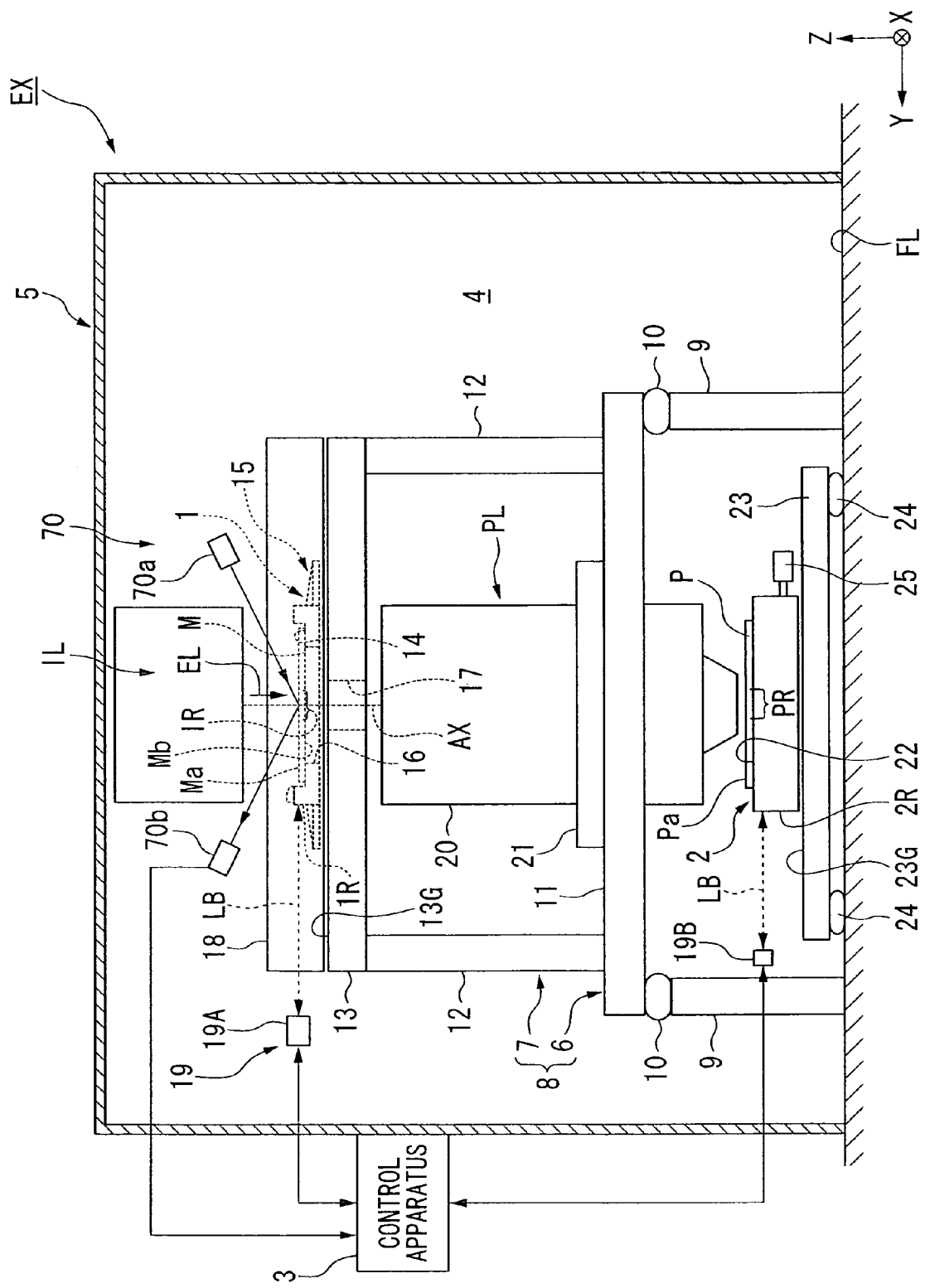
FIG. 1 is a schematic block diagram that shows one example of an exposure apparatus according to an embodiment of the present invention.

FIG. 1 is a schematic block diagram that shows one example of an exposure apparatus EX according to the first embodiment. In FIG. 1, the exposure apparatus EX comprises a movable mask stage 1 that holds a mask M; a movable substrate stage 2 that holds a substrate P; an illumination system IL, which illuminates the mask M supported by the mask stage 1 with exposure light EL; a projection optical system PL, which projects an image of a pattern of the mask M illuminated by the exposure light EL onto the substrate P held by the substrate stage 2; and a control apparatus 3, which controls the operation of the entire exposure apparatus EX. The control apparatus 3 includes, for example, a computer system. In addition, the exposure apparatus EX comprises a chamber apparatus 5 in which an internal space 4, wherein the substrate P is processed, is formed. The chamber apparatus 5 is capable of adjusting the environment (including the temperature, humidity, and cleanliness level) of the internal space 4.

The substrate P is a substrate for fabricating a device and may be a substrate wherein a photosensitive film is formed on a base material such as a semiconductor wafer, for example, a silicon wafer. The photosensitive film is made of a photosensitive material (e.g., photoresist). In addition, various films may be formed on the substrate P; for example, a protective (topcoat) film may be formed on the photosensitive film.

The mask M may be, for example, a reticle wherein a device pattern projected onto the substrate P is formed. In the present embodiment, the mask M is a transmissive mask wherein a light shielding film made of chrome and the like is used to form a prescribed pattern on a transparent plate, such as a glass plate. This transmissive mask is not limited to a binary mask wherein a pattern is formed with a light shielding film, but may also include, for example, a halftone type or a spatial frequency modulation type phase shift mask. In addition, although a transmissive mask is used as the mask M in the present embodiment, a reflective mask may also be used.

The exposure apparatus EX of the present embodiment is a scanning type exposure apparatus (i.e., a so-called scanning stepper) that exposes the substrate P with the exposure light EL through the mask M while synchronously moving the mask M and the substrate P in prescribed scanning directions. In the present embodiment, the scanning directions (i.e., the synchronous movement directions) of both the substrate P and the mask M are the Y axial directions. The exposure apparatus EX illuminates the mask M with the exposure light EL and radiates the exposure light EL that passes through the mask M to the substrate P through the projection optical system PL while both moving the substrate P in one of the Y axial directions with respect to a projection region PR of the projection optical system PL and moving the mask M in the other Y axial direction with respect to an illumination region IR of the illumination system IL synchronized to the movement of the substrate P. The illumination region IR of the illumination system IL includes an irradiation position of the exposure light EL that emerges from the illumination system IL, and the projection region PR of the projection optical system PL includes an irradiation position of the exposure light EL that emerges from the projection optical system PL.

The exposure apparatus EX comprises a body 8 that comprises: a first column (frame) 6, which is provided on a floor surface FL inside, for example, a clean room; and a second column (frame) 7, which is provided on the first column 6. The first column 6 comprises: a plurality of first support posts 9; and a first plate 11, which is supported by the first support posts 9 via vibration isolating apparatuses 10. The second column 7 comprises: a plurality of second support posts 12, which are provided on the first plate 11, and a second plate 13, which is supported by the second support posts 12.

The illumination system IL illuminates the prescribed illumination region IR with the exposure light EL, which has a uniform luminous flux intensity distribution. The mask M is capable of moving to the illumination region IR of the illumination system IL (i.e., the irradiation position of the exposure light EL). The illumination system IL illuminates at least part of the mask M disposed in the illumination region IR with the exposure light EL, which has a uniform luminous flux intensity distribution. Examples of light that can be used as the exposure light EL that emerges from the illumination system IL include: deep ultraviolet (DUV) light such as a bright line (g-line, h-line, or i-line) light emitted from, for example, a mercury lamp and KrF excimer laser light (with a wavelength of 248 nm); and vacuum ultraviolet (VUV) light such as ArF excimer laser light (with a wavelength of 193 nm) and $F_2$ laser light (with a wavelength of 157 nm). In the present embodiment, ArF excimer laser light, which is ultraviolet light (i.e., vacuum ultraviolet light), is used as the exposure light EL.

The mask stage 1 comprises a mask holding part 14, which holds the mask M when the mask M is irradiated with the exposure light EL. The mask holding part 14 is capable of chucking and releasing the mask M. In the present embodiment, the mask holding part 14 holds the mask M such that a lower surface Mb (i.e., a patterned surface) of the mask M is substantially parallel to the XY plane. The mask stage 1 is supported noncontactually by an upper surface 13G (i.e., a guide surface) of the second plate 13 via a gas bearing. In the present embodiment, the upper surface 13G of the second plate 13 is substantially parallel to the XY plane. The mask stage 1 holds the mask M and is capable of moving, by the operation of a mask stage drive apparatus 15 that comprises actuators such as linear motors, along the upper surface 13G of the second plate 13, which includes the irradiation position of the exposure light EL that emerges from the illumination system IL (i.e., the illumination region IR of the illumination system IL). In the present embodiment, in the state wherein the mask M is held by the mask holding part 14, the mask stage 1 is capable of moving on the second plate 13 in three directions: the X axial, Y axial, and θZ directions. The mask stage 1 has a first opening 16 through which the exposure light EL passes when, for example, the substrate P is exposed or when a measurement is performed using the exposure light EL. The second plate member 13 has a second opening 17 wherethrough the exposure light EL passes. The exposure light EL that emerges from the illumination system IL and illuminates the mask M passes through the first opening 16 and the second opening 17 and then enters the projection optical system PL.

In addition, a countermass 18 is provided on the second plate 13 that, in accordance with the movement of the mask stage 1 in one of the Y axial directions (e.g., the +Y direction), moves in the direction opposite that of the mask stage 1 (e.g., the −Y direction). The countermass 18 is supported noncontactually by the upper surface 13G of the second plate 13 via a self-weight cancelling mechanism, which comprises air pads. In the present embodiment, the countermass 18 is provided around the mask stage 1.

Laser interferometers 19A of an interferometer system 19 measure the position of the mask stage 1 (i.e., the mask M). The laser interferometers 19A radiate measurement light beams LB to reflecting surfaces 1R of the mask stage 1. The laser interferometers 19A use the measurement light beams LB, which are radiated to the reflecting surfaces 1R of the mask stage 1, to measure the position of the mask stage 1 in the X axial, Y axial, and θZ directions. The control apparatus 3 operates the mask stage drive apparatus 15 based on the measurement results of the interferometer system 19 (i.e., the laser interferometers 19A) to control the position of the mask M, which is held by the mask stage 1.

The projection optical system PL radiates the exposure light EL to the prescribed projection region PR. The substrate P is capable of moving to the projection region PR of the projection optical system PL (i.e., the irradiation position of the exposure light EL). The projection optical system PL projects with a prescribed projection magnification an image of the pattern of the mask M to at least part of the substrate P, which is disposed in the projection region PR. A lens barrel 20 holds the plurality of optical elements of the projection optical system PL. The lens barrel 20 comprises a flange 21. The flange 21 is supported by the first plate 11. The projection optical system PL of the present embodiment is a reduction system that has a projection magnification of, for example, ¼, ⅕, or ⅛. Furthermore, the projection optical system PL may alternatively be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The substrate stage 2 comprises a substrate holding part 22, which holds the substrate P that is irradiated by the exposure light EL. The substrate holding part 22 is capable of chucking and releasing the substrate P. In the present embodiment, the substrate holding part 22 holds the substrate P such that an exposure surface Pa (i.e., an upper surface) of the substrate P is substantially parallel to the XY plane. The substrate stage 2 is supported noncontactually by an upper surface 23G (i.e., a guide surface) of a third plate 23 via a gas bearing. In the present embodiment, the upper surface 23G of the third plate 23 is substantially parallel to the XY plane. The third plate 23 is supported by the floor surface FL via vibration isolating apparatuses 24. The substrate stage 2 holds the substrate P and is capable of moving, by the operation of a substrate stage drive apparatus 25 that comprises actuators such as linear motors, along the upper surface 23G of the third plate 23, which includes the irradiation position of the exposure light EL that emerges from the projection optical system PL (i.e., the projection region PR of the projection optical system PL). In the present embodiment, in the state wherein the substrate P is held by the substrate holding part 22, the substrate stage 2 is capable of moving on the third plate 23 in six directions: the X, Y, and Z axial directions, and the θX, θY, and θZ directions.

Laser interferometers 19B of the interferometer system 19 measure the position of the substrate stage 2 (i.e., the substrate P). The laser interferometers 19B radiate the measurement light beams LB to reflecting surfaces 2R of the substrate stage 2. The laser interferometers 19B use the measurement light beams LB, which are radiated to the reflecting surfaces 2R of the substrate stage 2, to measure the position of the substrate stage 2 in the X axial, Y axial, and θZ directions. In addition, a focus and level detection system (not shown) detects the surface position (i.e., the position in the Z axial, θX, and θY directions) of the exposure surface Pa of the substrate P held by the substrate stage 2. The control apparatus 3 controls the position of the substrate P, which is held by the substrate stage 2, by operating the substrate stage drive apparatus 25 based on the measurement results of the interferometer system 19 (i.e., the laser interferometers 19B) and the detection results of the focus and level detection system.

Figure 2:
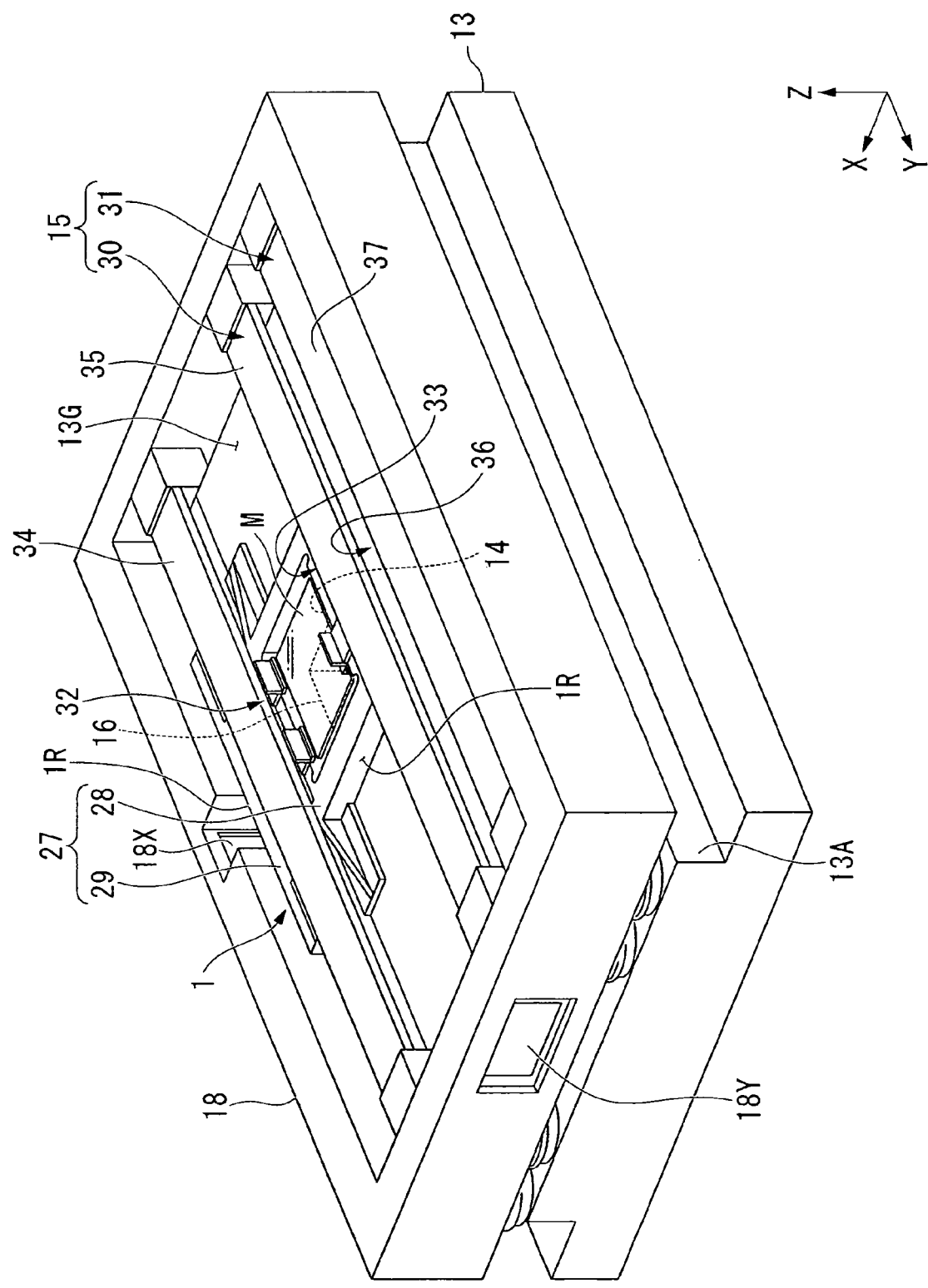
FIG. 2 is an oblique view of the vicinity of the mask stage according to the present embodiment.
Figure 3:
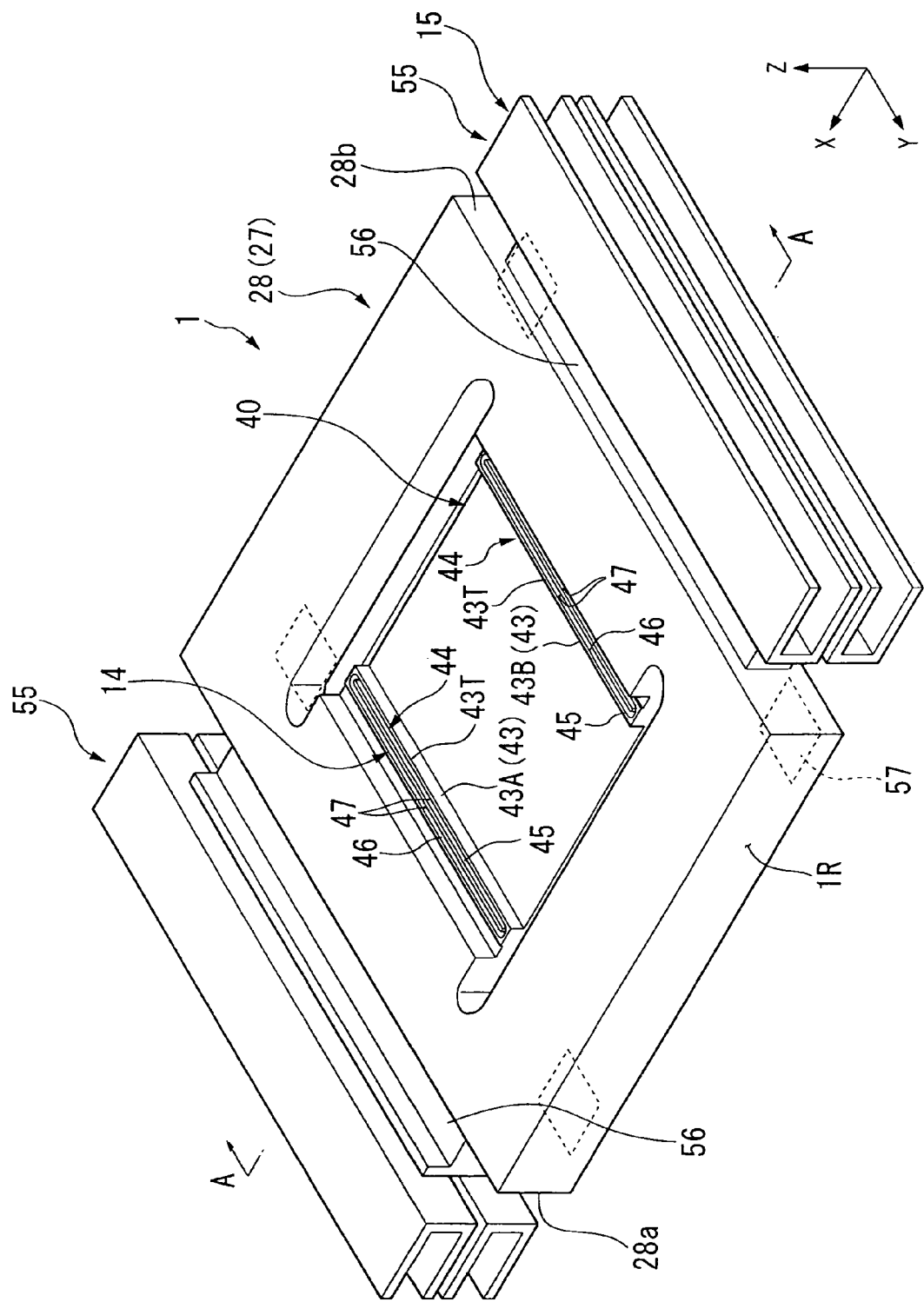
FIG. 3 is a partial, enlarged oblique view of the mask stage according to the present embodiment.

The mask stage 1 will now be explained, referencing FIG. 2, FIG. 3, and FIG. 4. FIG. 2 is an oblique view of the vicinity of the mask stage 1, the countermass 18, and the second plate 13 according to the present embodiment; FIG. 3 is an oblique view that shows the configuration of part of the mask stage 1; and FIG. 4 is a cross sectional auxiliary view taken along the A-A line in FIG. 3.

Figure 4:
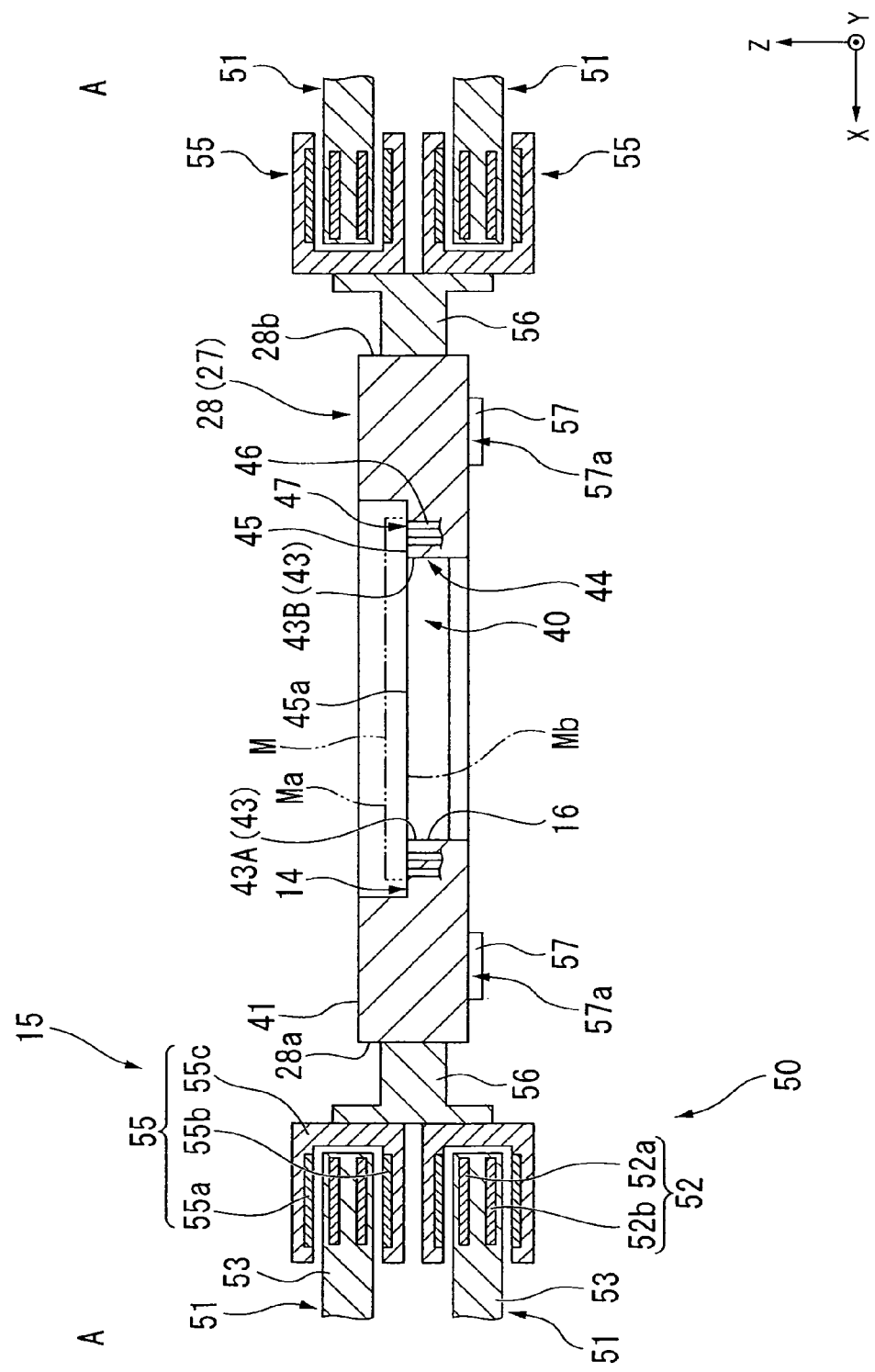
FIG. 4 is an oblique, cross sectional view taken along the A-A line in FIG. 3.

In FIGS. 2, 3, and 4, the mask stage 1 comprises a mask stage main body 27, which is provided with the mask holding part 14.

As shown in FIG. 2, the mask stage main body 27 comprises a first member 28, which is substantially rectangular within the XY plane, and a second member 29, which is long in the Y axial directions and is connected to the +X side end of the first member 28. The mask holding part 14 is provided to the first member 28. The first opening 16 is formed at substantially the center of the first member 28. The mask holding part 14 is disposed at least partly around the first opening 16.

The +Y side side surface of the first member 28 has one of the reflecting surfaces 1R, which is irradiated with the measurement light beam LB of one of the laser interferometers 19A. The reflecting surface 1R of the first member 28 is substantially perpendicular to the Y axis. A transmissive area 18Y, wherethrough the measurement light beam LB of the corresponding laser interferometer 19A can be transmitted, is disposed on the +Y side side surface of the countermass 18. This laser interferometer 19A is capable of radiating its measurement light beam LB to the reflecting surface 1R of the first member 28 through the transmissive area 18Y.

The +X side side surface of the first member 29 has one of the reflecting surfaces 1R, which is irradiated with the measurement light beam LB of one of the laser interferometers 19A. The reflecting surface 1R of the second member 29 is substantially perpendicular to the X axis. A transmissive area 18X, wherethrough the measurement light beam LB of the corresponding laser interferometer 19A can be transmitted, is disposed on the +X side side surface of the countermass 18. This laser interferometer 19A is capable of radiating its measurement light beam LB to the reflecting surface 1R of the second member 29 through the transmissive area 18X.

In the present embodiment, a protruding part 13A is provided at substantially the center of the second plate 13. The guide surface 13G of the second plate 13 includes the upper surface of the protruding part 13A. Vacuum preloaded air pads 57 are provided to the surface of the first member 28 that opposes the guide surface 13G. The air pads 57 blow air toward the guide surface 13G and thereby the first member 28 is levitationally (noncontactually) supported by the guide surface 13G with a clearance of, for example, several microns. In addition, the air pads 57 are configured such that they can maintain the abovementioned clearance by blowing air between the first member 28 and the guide surface 13G. The mask stage main body 27 is configured such that it is supported noncontactually by the upper surface 13G of the protruding part 13A via the air pads 57. The second opening 17 is provided at substantially the center of the protruding part 13A of the second plate 13.

As shown in FIG. 3 and FIG. 4, the first member 28 has a recessed part 40. The recessed part 40 is disposed in a rectangular area in the XY plane at substantially the center part of the first member 28. The mask holding part 14 is disposed on the inner side of the recessed part 40. The first opening 16, wherethrough the exposure light EL passes, is disposed on the inner side of the recessed part 40. The first opening 16 is disposed in a rectangular area in the XY plane at substantially the center part of the recessed part 40.

The mask holding part 14 comprises: pedestals 43, which are disposed at the perimeter of the first opening 16; and chucking pads 44, which are provided to the pedestals 43. The chucking pads 44 are provided to upper surfaces 43T of the pedestals 43. The pedestals 43 (namely, an +X pedestal 43A and a −X pedestal 43B) and the chucking pads 44 are disposed along two opposing sides of the four sides of the first opening 16 and are oriented such that their longitudinal directions are in the Y axial directions. Each of the chucking pads 44 has a holding surface 45 that holds at least part of the lower surface Mb of the mask M.

Each of the holding surfaces 45 includes at least part of the upper surface 43T of the corresponding pedestal 43. In the present embodiment, the holding surfaces 45 are substantially parallel to the XY plane. In addition, in the present embodiment, the surface inside the recessed part 40 that includes the holding surfaces 45 is a mounting surface 45a, whereon the mask M is mounted. Each of the chucking pads 44 comprises: a groove 46, which is formed in part of the upper surface 43T of the corresponding pedestal 43; and suction ports 47, which are formed on the inner sides of the groove 46. Each of the holding surfaces 45 includes a portion of the upper surface 43T of the corresponding pedestal 43 wherein the groove 46 is not formed. The suction ports 47 are connected to a suction apparatus, which comprises a vacuum system, via passageways (not shown).

Each of the chucking pads 44 holds the mask M such that at least part of the lower surface Mb of the mask M is chucked. By operating the suction apparatus, which is connected to the suction ports 47, in the state wherein the chucking pads 44 and the holding surfaces 45 have been brought into contact with part of the lower surface Mb of the mask M, the suction ports 47 suction the gas from the space enclosed by the lower surface Mb of the mask M and the inner surfaces of the grooves 46, thereby negatively pressurizing the space. Thereby, the lower surface Mb of the mask M is chucked to the holding surfaces 45. The mask stage 1 is capable of moving while the holding surfaces 45 hold the mask M. In addition, the mask M can be removed from the mask holding part 14 by stopping the suction operation wherein the suction ports 47 are used.

The mask M has a patterned area, wherein a pattern is formed, in part of the lower surface Mb, and the chucking pads 44, which include the holding surfaces 45, hold that area of the lower surface Mb of the mask M that lies outside of the patterned area. The mask holding part 14 holds the mask M such that the patterned area of the mask M is disposed in the first opening 16. The mask holding part 14 holds the mask M such that the lower surface Mb of the mask M is substantially parallel to the XY plane. In addition, an upper surface Ma of the mask M, which is held by the mask holding part 14, is substantially parallel to the XY plane.

The mask stage drive apparatus 15 is capable of moving the mask stage 1. The mask stage drive apparatus 15 comprises a first drive apparatus 30, which is capable of moving the mask stage 1 in the Y axial and θZ directions, and a second drive apparatus 31, which is capable of moving the mask stage 1 in the X axial directions. In the present embodiment, the first drive apparatus 30 comprises a pair of linear motors 32, 33. The second drive apparatus 31 comprises a voice coil motor 36.

The first drive apparatus 30 comprises a pair of guide members 34, 35, each of which is long in the Y axial directions (i.e., the movement directions). The guide members 34, 35 are disposed on the inner side of the countermass 18. The guide member 34 is disposed on the +X side of the first member 28, and the guide member 35 is disposed on the −X side of the first member 28. Accordingly, the guide members 34, are provided at positions spaced apart in the X axial directions. The +Y and −Y side ends of the guide members 34, 35 are fixed to the inner surface of the countermass 18 via prescribed fixed members. The guide members 34, 35 are supported such that they are capable of moving the mask stage main body 27 in the Y axial directions.

The guide members 34, 35 each have coil units 51 that function as the stators of the linear motors 32, 33. As shown in FIG. 4, for each of the guide members 34, 35 two coil units 51 are disposed such that they are arrayed in the Z axial directions. Each of the coil units 51 comprises a coil part 52 and a coil holding member 53, which holds the coil part 52. The coil holding members 53 are disposed along the guide members 34, 35 and are configured such that they are long in the Y axial directions. Each of the coil parts 52 comprises two coils 52a, 52b, which are disposed in the Z axial directions. The coils 52a, 52b are arrayed such that their U phases, V phases, and W phases repeat along the Y axial directions. Each coil 52a and its corresponding coil 52b are provided at positions such that they overlap in a plan view, and electric currents can be flowed thereto independently. Accordingly, the electric currents that flow to each of the coils 52a and its corresponding coil 52b can be flowed in the same direction or in different directions.

In the present embodiment, the first member 28 of the mask stage main body 27 comprises magnet units 55 that function as the sliders of the linear motors 32, 33. The magnet units 55 are disposed at a +X side end surface 28a and a −X side end surface 28b of the first member 28; two units are disposed on each side and arrayed in the Z axial directions such that they correspond to the two coil units 51 of each of the guide members 34, 35. The magnet units 55 are fixed to the +X side end surface 28a and the −X side end surface 28b of the first member 28 via fixed members 56. The end surfaces 28a, 28b are first positions at which the driving forces of the mask stage drive apparatus (mask stage drive mechanism, correcting mechanism) 15 is applied.

Each of the magnet units 55 comprises a magnet 55a, which is disposed on the +Z side, a magnet 55b, which is disposed on the −Z side, and a magnet holding member 55c, which holds the magnets 55a, 55b. Each of the magnets 55a, opposes the coil 52a of the corresponding coil unit 51, and each of the magnets 55b opposes the coil 52b of the corresponding coil unit.

In the present embodiment, the slider provided to the +X side end surface 28a of the first member 28 and the stator provided to the guide member 34 together form the moving magnet type linear motor 32, which is capable of moving the mask stage main body 27 in the Y axial directions. Similarly, the slider provided to the −X side end surface 28b of the first member 28 and the stator provided to the guide member 35 together form the moving magnet type linear motor 33, which is capable of moving the mask stage main body 27 in the Y axial directions.

The control apparatus 3, by equalizing the thrusts generated by the pair of linear motors 32, 33, can control the position of the mask stage 1 (i.e., the mask stage main body 27) in the Y axial directions by moving the mask stage 1 in those directions. In addition, the control apparatus 3, by making the thrusts generated by the pair of linear motors 32, 33 different from one another, can control the position of the mask stage 1 (i.e., the mask stage main body 27) in the θZ directions by moving (i.e., rotating) the mask stage 1 in those directions. In addition, the thrusts of the pair of linear motors 32, 33 can be applied to the end surface 28a and the end surface 28b independently.

The second drive apparatus 31 comprises a guide member 37, which is long in the Y axial directions. The guide member 37 comprises a coil unit that functions as the stator of the voice coil motor 36. The guide member 37 is disposed on the inner side of the countermass 18. The guide member 37 is disposed on the −X side of the guide member 35. The +Y and −Y side ends of the guide member 37 are fixed to the inner surface of the countermass 18 via prescribed fixed members.

A magnet unit, which functions as the slider of the voice coil motor 36, is disposed on the −X side end of the mask stage main body 27.

In the present embodiment, the slider provided to the −X side end of the mask stage main body 27 and the stator provided to the guide member 37 together form the moving magnet type voice coil motor 36, which is capable of moving the mask stage main body 27 in the X axial directions.

By flowing an electric current to the coil unit of the stator of the voice coil motor 36, the control apparatus 3, based on both the electric current that flows through the coil unit and the magnetic field generated by the magnet unit of the slider, can generate an electromagnetic force (i.e., Lorentz's force) in the X axial directions. The control apparatus 3 can control the position of the mask stage 1 (i.e., the mask stage main body 27) in the X axial directions by using the reaction force of that Lorentz's force to move the mask stage 1 in the X axial directions.

Thus, the mask stage drive apparatus 15, which includes the first and second drive apparatuses 30, 31, can move the mask stage 1 in three directions: the X axial, Y axial, and θZ directions. The mask stage main body 27 holds the mask M using the mask holding part 14 and can move within the XY plane that includes the irradiation position of the exposure light EL (i.e., the illumination region IR of the illumination system IL).

The countermass 18 is a rectangular frame shaped member that has an opening wherein the mask stage 1 can be disposed and is capable of moving on the upper surface of the second plate 13 to offset the reaction force that accompanies the movement of the mask stage 1. The countermass 18 offsets the reaction force that accompanies the movement of the mask stage 1 by moving in a direction opposite to the movement direction of the mask stage 1.

In addition, the control apparatus 3 is capable of performing control such that a thrust in the Z axial directions is applied to each of the magnet units 55 by flowing currents of different directions to the coils 52a, 52b of each of the coil units 51.

Figure 5:
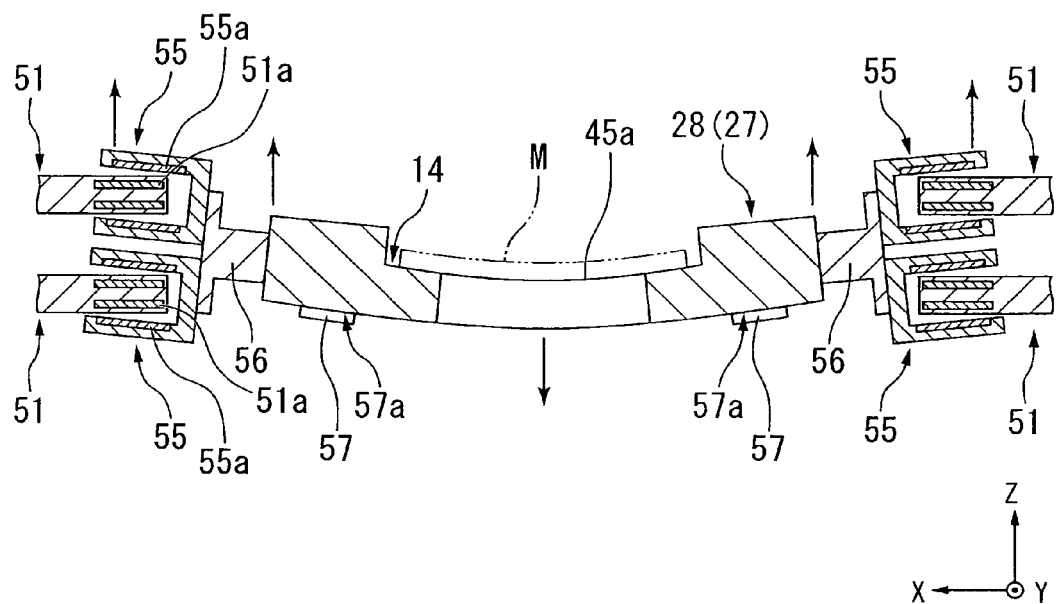
FIG. 5 is a cross sectional view that shows the operation of correcting the mask stage.

As shown in FIG. 5, if a thrust is applied to each of the magnet units 55 in, for example, the +Z direction, then each of the magnet units 55 will attempt to move in the +Z direction. In contrast, because the first member 28 is restrained by the air pads 57 such that a fixed clearance is maintained between the first member 28 and the guide surface 13G, the first member 28 is pulled in the −Z direction by the air pads 57 and held such that the position of each of the portions 57a that contact the air pads 57 does not change. In a plan view, the air pads 57 are disposed at positions different from the positions 57a at which the magnet units 55 overlap; consequently, moments in the θY directions, using the portions at which the air pads 57 are provided as fulcrums, are applied to the side of each of the magnet units 55 opposite the corresponding air pad 57 in the X axial directions such that the +X side and −X side end surfaces provided to each of the magnet units 55 are the points of force application. Accordingly, in the present embodiment, the portions 57a of the first member 28 at which the air pads 57 are provided constitute second positions.

In the present embodiment, the magnet units 55 are provided to the end surfaces 28a, 28b of the first member 28 in the X axial directions; moreover, the end surfaces 28a, 28b, which constitute the first positions, are provided such that they sandwich the portions 57a (i.e., the second positions) of the first member 28, which are the fulcrums, that contact the air pads 57; consequently, the moments, wherein the magnet units 55 on both sides are the points of force application, are applied to the center part of the first member 28 in the X axial directions. Accordingly, a −Z direction force acts on the center part of the first member 28 in the X axial directions. This force bends the first member 28 in the −Z direction and, attendant therewith, the center part of the mounting surface 45a of the mask holding part 14 in the X axial directions bends in the −Z direction. In the state wherein the mask M is mounted to the mounting surface 45a, the center part of the mask M in the X axial directions bends in the −Z direction as the mounting surface 45a deforms. Consequently, the position of the front surface of the mask M in the Z directions moves in the −Z direction.

Figure 6:
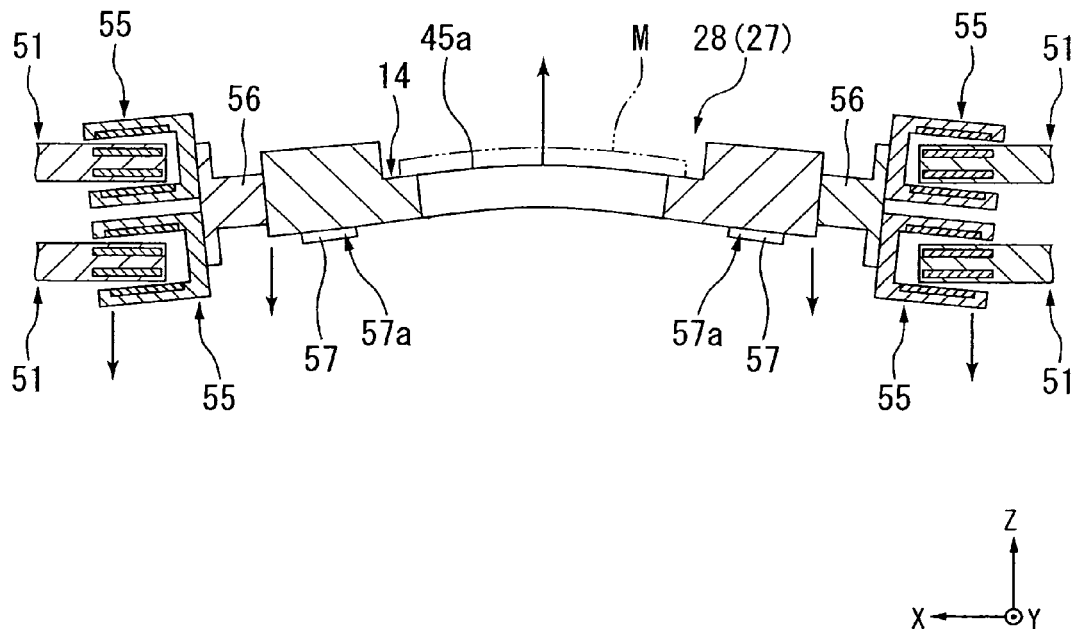
FIG. 6 is a cross sectional view that shows the operation of correcting the mask stage.

Conversely, if a thrust is applied to each of the magnet units 55 in, for example, the −Z direction as shown in FIG. 6, then each of the magnet units 55 will attempt to move in the −Z direction. Consequently, based on a principle similar to that wherein the thrusts are applied in the +Z direction, moments around the θY directions, wherein the portions at which the air pads 57 are provided serve as the fulcrums, are applied to the sides of each of the magnet units 55 opposite the corresponding air pad 57 in the X axial directions such that the +X side and −X side end surfaces provided to the magnet units 55 are the points of force application. Because the magnet units 55 are provided to both end surfaces of the first member 28 in the X axial directions, moments, wherein the magnet units 55 on both sides serve as points of force application, are applied to the center part of the first member 28 in the X axial directions. The direction in which the force acts is opposite that of the case wherein the thrusts are applied in the +Z direction, and therefore a −Z direction force acts on the center part of the first member 28 in the X axial directions. As a result of this force, the first member 28 bends in the +Z direction and, attendant therewith, the center part of the mounting surface 45a of the mask holding part 14 in the X axial directions bends in the +Z direction. In the state wherein the mask M is mounted to the mounting surface 45a, the center part of the mask M in the X axial directions bends in the +Z direction as the mounting surface 45a deforms. Consequently, the position of the front surface of the mask M in the Z directions moves in the +Z direction.

Thus, the mask stage drive apparatus (mask stage drive mechanism, correcting mechanism) 15 functions as a correcting mechanism that corrects the shape of the mounting surface 45a of the mask stage 1 and thereby corrects warpage in the shape (deformation) of the mask M mounted to the mounting surface 45a.

In addition, in the present embodiment as shown in FIG. 1, a focus and level detection system 70 is provided. The focus and level detection system 70 detects the surface position (i.e., the position in the Z axial, θX, and θY directions) of the front surface of the mask M. The focus and level detection system 70 comprises a light projecting system 70a, which projects a detection light to the illumination region IR of the mask M held by the mask holding part 14 that is irradiated with the exposure light EL, and a light receiving system 70b, that is capable of receiving the detection light via the mask M. The light projecting system 70a diagonally projects the detection light to the front surface of the mask M. The light receiving system 70b receives the detection light that is projected by the light projecting system 70a to the front surface of the mask M and is then reflected thereby. The light receiving system 70b is connected to the control apparatus 3 and supplies, as information regarding changes in the shape of the mounting surface, a signal based on the received light to a table T1 of the control apparatus 3. The information regarding changes in the shape of the mounting surface is stored as individual positional coordinates in, for example, the Z axial directions (e.g., Z1-Z7).

In addition, shape information regarding the pattern formed on the substrate P (i.e., information regarding the projected image of the projection optical system PL) is derived in advance either empirically or by simulation, or both. The image information is the information associated with the information regarding position of the illumination region IR of the mask M in the Z axial directions. Associating the positional information with the image information can be accomplished by associating the positional information with the kind of image obtained at each coordinate, for example, Z1-Z7, based on the pattern information obtained when exposures are performed while changing the position of the illumination region IR of the mask M in the Z axial directions from Z1 through to Z7.

Figure 7:
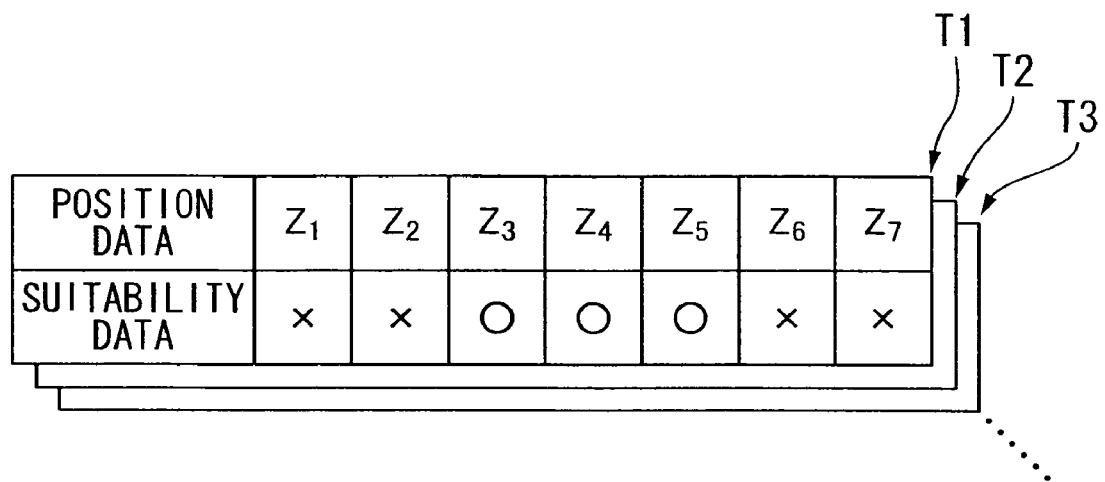
FIG. 7 schematically shows information stored in a control apparatus.

In addition, each piece of image information is examined to determine in advance whether it is suitable; namely, the suitability of each pattern is determined in advance, and the suitability data is stored as the table T1 such that the suitability data is associated with the positional data Z1-Z7, as shown in FIG. 7. In the present embodiment, the table T1 comprises data that correlates the information regarding changes in the shape of the mounting surface 45a and the information regarding the projected image of the projection optical system PL. The table T1 shows a case wherein the pattern is unsuitable at the positions that correspond to the positional data Z1, Z2, Z6, Z7 and suitable at the positions that correspond to the positional data Z3-Z5.

Accordingly, the control apparatus 3 can obtain pattern suitability data with respect to desired positional data, as shown in FIG. 7. Conversely, positional data that corresponds to the pattern suitability data can also be obtained. Furthermore, as shown in FIG. 7, different tables T2, T3, . . . are prepared in advance in accordance with, for example, the mask types.

The following text explains one example of the operation of the exposure apparatus EX according to the present embodiment. The mask M is transported to the mask holding part 14; in addition, the lower surface Mb of the mask M is chucked to the holding surfaces 45 and thereby the mask M is mounted to the mounting surface 45a. In addition, the substrate P is transported to and held by the substrate holding part 22. The control apparatus 3 starts the exposure of the substrate P in the state wherein the environment (including the temperature, the humidity, and the cleanliness level) of the internal space 4 has been adjusted by the chamber apparatus 5.

The control apparatus 3 illuminates the mask M with the exposure light EL from the illumination system IL and exposes the substrate P with the exposure light EL, which travels through the mask M and the projection optical system PL, while moving the substrate P in one of the Y axial directions with respect to the projection region PR of the projection optical system PL and moving the mask M in the other Y axial direction with respect to the illumination region IR of the illumination system IL synchronized to the movement of the substrate P by operating the mask stage drive apparatus 15 and the substrate stage drive apparatus 25. Thereby, the image of the pattern of the mask M is projected to the substrate P through the projection optical system PL.

When the lower surface Mb of the mask M is chucked to the holding surfaces 45, there are cases wherein the shape of the mask M warps in the Z axial directions. If the exposure is started in this state, exposure failures, such as a reduction in the overlay accuracy of and the production of defects in the pattern formed on the substrate P, might occur.

Accordingly, in the present embodiment, an exposure is performed while the focus and level detection system 70 detects the position of the front surface of the mask M—particularly the illumination region IR—in the Z axial directions (i.e., detects information regarding the shape of the mounting surface) and, based on this positional information, corrects the position of the mask M in the Z axial directions. Specifically, based on the information regarding the position in the Z axial directions detected by the focus and level detection system 70, the control apparatus 3 apprehends the suitability data in the table T1, which is stored in the control apparatus 3.

If the apprehended suitability data constitutes a suitable pattern, then the control apparatus 3 continues the exposure operation without correcting the position of the mask M in the Z axial directions. However, if the apprehended suitability data constitutes an unsuitable pattern, then the control apparatus 3 retrieves the positional data that corresponds to stored suitability data for which the pattern is suitable and, based on that positional data, corrects the position of the mask M in the Z axial directions.

When the position of the mask M in the Z axial directions is corrected—for example, when the mask M must be moved in the +Z direction—control is performed such that a thrust in the −Z direction is applied to each of the magnet units 55. In addition, if the mask M must be moved in the −Z direction, then control is performed such that a thrust in the +Z direction is applied to each of the magnet units 55. The position of the mask M is corrected with every scan. Consequently, even if the warpage of the shape of the mask M is complex, the position of the illumination region IR in the Z axial directions can be corrected to a suitable position with each scan.

According to the present embodiment as explained above, the mask stage drive mechanism 15 can correct the shape of the mounting surface 45a, and therefore the shape of the surface that contacts the mounting surface 45a—namely, the shape of the mask M on the mounting surface 45a—can be deformed to a desired shape by the mounting surface 45a, whose shape has been corrected. Thereby, the warpage of the shape of the mask M on the mounting surface 45a can be corrected.

Accordingly, the shape of the mask M on the mounting surface 45a can be corrected so that, for example, the pattern formed on the mask M is focused on the surface (to be exposed) of a substrate P to be exposed.

For example, in the mask stage 1 having a configuration shown in FIG. 3 and FIG. 4, by generating the Z thrust in a range of approximately 5 N to approximately 20 N with the mask stage drive apparatus 15, the mounting surface 45a of the mask holding part 14 can be deformed with a curvature (warpage) having an maximum amplitude in a range of approximately +100 nm (or −100 nm) to approximately +200 nm (or −200 nm). When the mask M is held on the mask holding part 14, the mask M is supported so as to cover the first opening 16; therefore, the part above the opening may be deformed with a curvature (warpage) in a direction of gravitational force (an optical axis direction of the exposure light EL). In this case, the projection optical system PL can have optical characteristics that can be set based on the predictive value of the curvature (warpage) of the mask M. However, when the value of the curvature of the mask M has poor repeatability from any case, or when the values of the curvature of some masks M are different from each other, an actual value may beyond an allowable range which has been set. For this case, in the present embodiment, the curvature (warpage) of the mounting surface 45a of the mask holding part 14 can be adjusted so that the shape of the mask M can be changed to be within the allowable range. The cause is not limited to the mask M. When the value is beyond the allowable range because that the difference in dimension of the mounting surface 45a or the like along with the machining accuracy for the exposure apparatus, the curvature (warpage) of the mounting surface 45a of the mask holding part 14 can be also adjusted so that the shape of the mask M can be changed to be within the allowable range.

In the above-described embodiment, the feature of the present invention is applied to the mask stage; alternatively, the feature can be applied to the substrate stage 2 so that the shape of the substrate P can be corrected. In this case, the substrate P can be mounted on a substrate holding member having a plate shape, and the shape of the mounting surface of the substrate holding member can be adjusted. As the actuator for the correcting mechanism, a Z drive mechanism, which already has been provided, for focusing leveling can be used, or another actuator for a correcting mechanism can be provided.

The above text explained an embodiment of the present invention based on the drawings, but its specific constitution is not limited to these embodiments, and it is understood that variations and modifications may be effected without departing from the spirit and scope of the invention.

Figure 8:
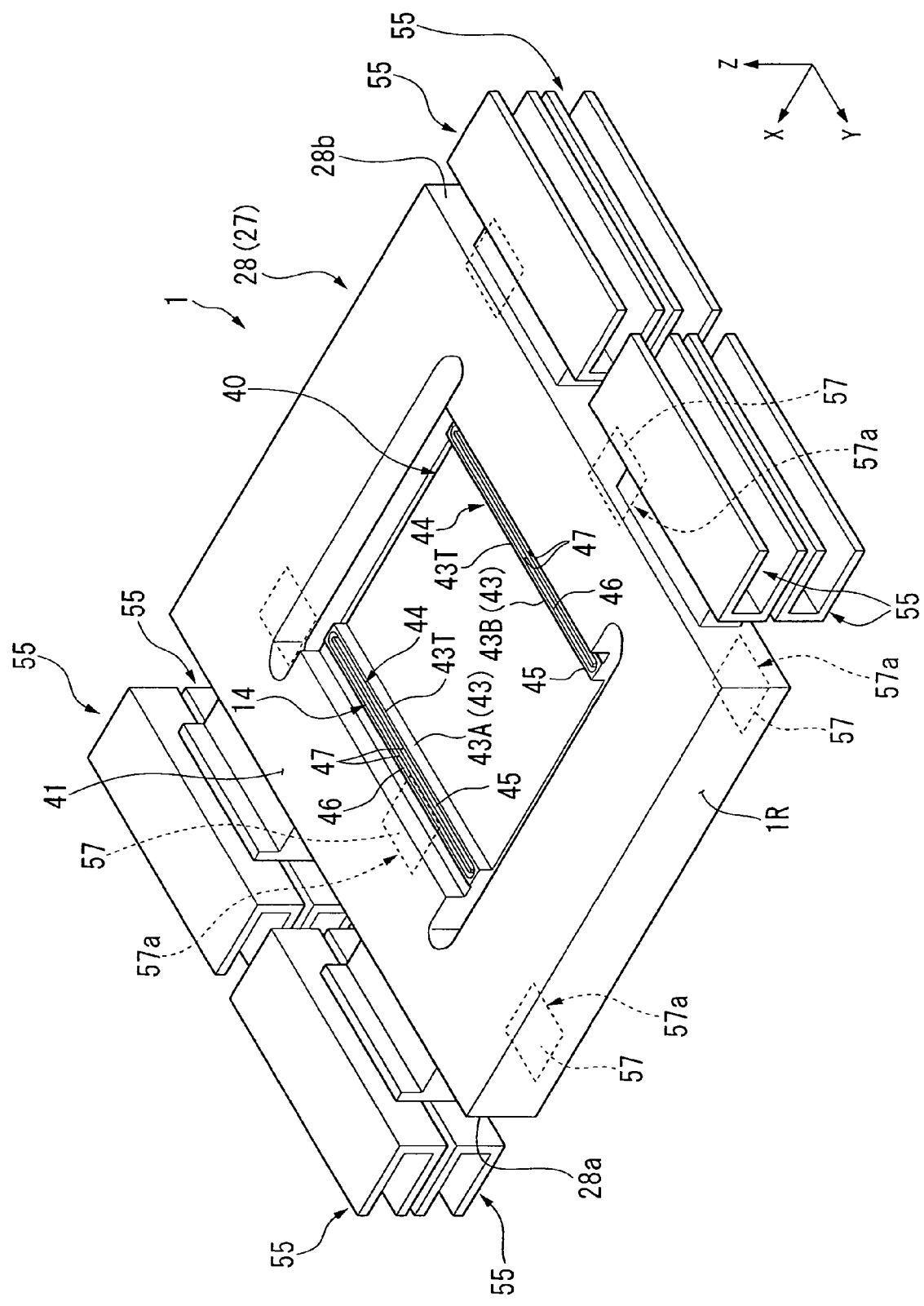
FIG. 8 is an oblique view that shows another configuration of the mask stage according to the present invention.

For example, the configuration of the correcting mechanism is not limited to one in the embodiments. In the abovementioned embodiment, a configuration is adopted wherein the magnet units 55, which are constituent elements of the mask stage drive apparatus 15, are disposed at two locations of the end surface 28a of the first member 28 and two locations of the end surface 28b of the first member 28, but the present invention is not limited thereto; as shown in FIG. 8. For example, a configuration may be adopted wherein the magnet units 55 are disposed at four locations of the end surface 28a of the first member 28 and four locations of the end surface 28b of the first member 28.

In addition, the number of locations of the magnet units 55 is not limited to four, and a configuration may be adopted wherein the number of locations is five or more or three. Thereby, the positions of the points of force application would increase and more complex moments would be applied to the mask stage 1, thus increasing the accuracy with which the shape of the mask M is corrected.

In the embodiment, the magnet unit 55 provided at the end surface 28a of the first member 28 forms a part of the linear motor 32, and the magnet units 55 provided at the end surface 28b of the first member 28 forms the part of the linear motor 33. In this case, each of the linear motors 32 and 33 has two pairs of up- and down linear motor units; however, they are not limited to this configuration. For example, they each can have one pair of linear motor units.

In addition, the number of positions of points of force application on the magnet units 55 may be increased along with the number of air pads 57. In FIG. 8, the air pads 57 are located at six positions, but naturally they may be located at more than six positions. Thereby, the number of fulcrum positions with respect to the points of force application would increase and, consequently, far more complex moments would be applied to the mask stage 1, thereby increasing correction accuracy. In addition, the number of air pads 57 may also be three or fewer. Concentrating the fulcrums is advantageous in that it enables stable correction.

In addition, in the abovementioned embodiment, a configuration is adopted wherein the mask stage drive apparatus 15, which moves the mask M along X and Y directions functions as a correcting mechanism that corrects the shape of the mounting surface 45a, but the present invention is not limited thereto. For example, the correcting mechanism can be configured so that a mechanism, such as an actuator or an air bearing, can be separately provided that corrects the shape of the mounting surface 45a.

In the embodiment, as a means (correcting mechanism) for generating a force, a linear motor or an air bearing is used; however, the means is not limited to this. A rotary motor, a magnetic bearing or the like, which can apply force to the mounting surface, can be used as the means.

In the above-described embodiment, the actuators or the like are substantially symmetrically disposed at both the end surfaces 28a and 28b of the first member 28; however, the configuration is not limited to this. For example, a first side of the first member 28 can be fixed (or disposed substantially without displacement), and an actuator can be disposed at a second side, so that the displacement can be generated at the second side to apply a force to the first member 28 and to change the shape of the first member 28.

In addition, in the abovementioned embodiment, when the shape of the mounting surface 45a is corrected, the amount of correction is adjusted based on data that correlates the information regarding changes in the shape of the mounting surface with information regarding the projected image of the projection optical system, but the present invention is not limited thereto. For example, the information regarding changes in the shape of the mounting surface (e.g., the quantity detected by the focus and level detection system 70) or the information regarding the projected image of the projection optical system may be used independently to adjust the amount of correction. For example, when there is a difference from a predetermined state caused by a shape of one mask M or by a state where the mask M is held on the mounting surface 45a, the correcting mechanism can be used without relation to the information regarding the projected image of the projection optical system.

The focus leveling control can be executed in cooperation with the correction of the shape of the mask with the correcting mechanism as described above, and additionally in cooperation with the positional control of the substrate P with the substrate stage driving apparatus 25 of the substrate stage 2 and the like (e.g., the drive for focusing leveling).

Furthermore, when the values of the curvature (warpage) differ between masks as described above, the correcting mechanism can correct the value to be within a substantially steady range (e.g., allowable range). In addition, in a case in which the irradiation of the exposure light EL or the like causes thermal deformation of the mask M and in which the shape of the mask M is changed from the desired state (desired shape), the shape of the mask M can be corrected by means of the correcting mechanism. In this case, the deformation amount of the mask M can be predicted based on the irradiation amount of the exposure light EL, so that the correction can be executed by means of the correcting mechanism while the exposure processing in order to compensate the thermal deformation of the mask M.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (i.e., synthetic quartz or a silicon wafer) used by an exposure apparatus.

The exposure apparatus EX can also be adapted to a step-and-scan type scanning exposure apparatus (i.e., a scanning stepper) that scans and exposes the pattern of the mask M by synchronously moving the mask M and the substrate P, as well as to a step-and-repeat type projection exposure apparatus (i.e., a stepper) that successively steps the substrate P and performs a full field exposure of the pattern of the mask M with the mask M and the substrate P in a stationary state.

Furthermore, when performing an exposure with a step-and-repeat system, the projection optical system is used to transfer a reduced image of a first pattern onto the substrate P in a state wherein the first pattern and the substrate P are substantially stationary, after which the projection optical system may be used to perform a full-field exposure of the substrate P, wherein a reduced image of a second pattern partially superposes the transferred first pattern in a state wherein the second pattern and the substrate P are substantially stationary (i.e., as in a stitching type full-field exposure apparatus). In addition, the stitching type exposure apparatus can also be adapted to a step-and-stitch type exposure apparatus that successively steps the substrate P and transfers at least two patterns onto the substrate P such that they are partially superposed.

In addition, the present invention can also be adapted to, for example, an exposure apparatus that combines on a substrate the patterns of two masks through a projection optical system by double exposing, substantially simultaneously, a single shot region on a substrate using a single scanning exposure, as disclosed in, for example, U.S. Pat. No. 6,611,316. In addition, the present invention can also be adapted to, for example, a proximity type exposure apparatus and a mirror projection aligner.

In addition, the exposure apparatus EX can also be adapted to a twin stage type exposure apparatus, which comprises a plurality of substrate stages, as disclosed in, for example, U.S. Pat. Nos. 6,341,007, 6,400,441, 6,549,269, 6,590,634, 6,208,407, and 6,262,796.

Furthermore, as disclosed in, for example, U.S. Pat. No. 6,897,963 and European Patent Application Publication No. 1713113, the present invention can also be adapted to an exposure apparatus provided with a substrate stage that holds the substrate, and a measurement stage whereon either a fiducial member (wherein a fiducial mark is formed) or various photoelectric sensors, or both, are mounted. In addition, the exposure apparatus can be adapted to an exposure apparatus that comprises a plurality of substrate stages and measurement stages.

In addition, the present invention can also be adapted to an immersion exposure apparatus that exposes the substrate with exposure light through a liquid, as disclosed in, for example, PCT International Publication No. WO99/49504. In addition, the present invention can also be adapted to an EUV light source exposure apparatus that exposes the substrate P with extreme ultraviolet light.

The type of exposure apparatus EX is not limited to a semiconductor device fabrication exposure apparatus that exposes the substrate P with the pattern of a semiconductor device, but can also be widely adapted to exposure apparatuses used to fabricate, for example, liquid crystal devices or displays, and to exposure apparatuses used to fabricate thin film magnetic heads, image capturing devices (CCDs), micromachines, MEMS devices, DNA chips, or reticles and masks.

Furthermore, in each of the abovementioned embodiments, the positional information of the mask stage 1 and the substrate stage 2 is measured using the interferometer system 19, but the present invention is not limited thereto and, for example, an encoder system may be used that detects a scale (i.e., a diffraction grating) provided to each stage. In this case, the system would preferably be configured as a hybrid system that is provided with both an interferometer system and an encoder system; moreover, it would be preferable to use the measurement results of the interferometer system to calibrate the measurement results of the encoder system. In addition, the positions of the stages may be controlled by switching between the interferometer system and the encoder system, or by using both.

In addition, in each of the embodiments discussed above, an ArF excimer laser may be used as a light source apparatus that generates ArF excimer laser light, which serves as the exposure light EL; however, as disclosed in, for example, U.S. Pat. No. 7,023,610, a harmonic generation apparatus may be used that outputs pulsed light with a wavelength of 193 nm and that comprises: an optical amplifier part, which has a solid state laser light source (such as a DFB semiconductor laser or a fiber laser), a fiber amplifier, and the like; and a wavelength converting part. Moreover, in the abovementioned embodiments, both the illumination region and the projection region are rectangular, but they may be some other shape, for example, arcuate. Furthermore, in each of the embodiments discussed above, an optically transmissive mask is used wherein a prescribed shielding pattern (or phase pattern or dimming pattern) is formed on an optically transmissive substrate; however, instead of such a mask, a variable pattern forming mask (also called an electronic mask, an active mask, or an image generator), wherein a transmissive pattern, a reflective pattern, or a light emitting pattern is formed based on electronic data of the pattern to be exposed, may be used as disclosed in, for example, U.S. Pat. No. 6,778,257. The variable pattern forming mask comprises a digital micromirror device (DMD), which is one kind of non-emissive type image display device (e.g., a spatial light modulator). In addition, the variable forming mask is not limited to a DMD, and a non-emissive type image display device, which is explained below, may be used instead. Here, the non-emissive type image display device is a device that spatially modulates the amplitude (i.e., the intensity), the phase, or the polarization state of the light that travels in a prescribed direction; furthermore, examples of a transmissive type spatial light modulator include a transmissive type liquid crystal display (LCD) as well as an electrochromic display (ECD). In addition, examples of a reflecting type spatial light modulator include a DMD, which was discussed above, as well as a reflecting mirror array, a reflecting type LCD, an electrophoretic display (EPD), electronic paper (or electronic ink), and a grating light valve.

In addition, instead of a variable pattern forming mask that comprises a non-emissive type image display device, a pattern forming apparatus that comprises a self luminous type image display device may be provided. In this case, an illumination system is not necessary. Here, examples of a self luminous type image display device include a cathode ray tube (CRT), an inorganic electroluminescence display, an organic electroluminescence display (OLED: organic light emitting diode), an LED display, an LD display, a field emission display (FED), and a plasma display (PDP: plasma display panel). In addition, a solid state light source chip that has a plurality of light emitting points or that creates a plurality of light emitting points on a single substrate, a solid state light source chip array wherein a plurality of chips are arrayed, or the like may be used as the self luminous type image display device that constitutes the pattern forming apparatus, and the pattern may be formed by electrically controlling the solid state light source chip or chips. Furthermore, it does not matter whether the solid state light source device is inorganic or organic.

In this case, tables T1, T2, T3, . . . , which correspond to each of the masks, are prepared in advance in the control apparatus 3, and thereby warpage can be corrected regardless of the mask type.

Each of the embodiments discussed above explained an exemplary case of an exposure apparatus that comprises the projection optical system PL, but the present invention can be adapted to an exposure apparatus and an exposing method that do not use the projection optical system PL. Thus, even if the projection optical system PL were not used, then the exposure light would be radiated to the substrate through an optical member, such as a lens.

As described above, the exposure apparatus EX of the embodiments in the present application is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 9:
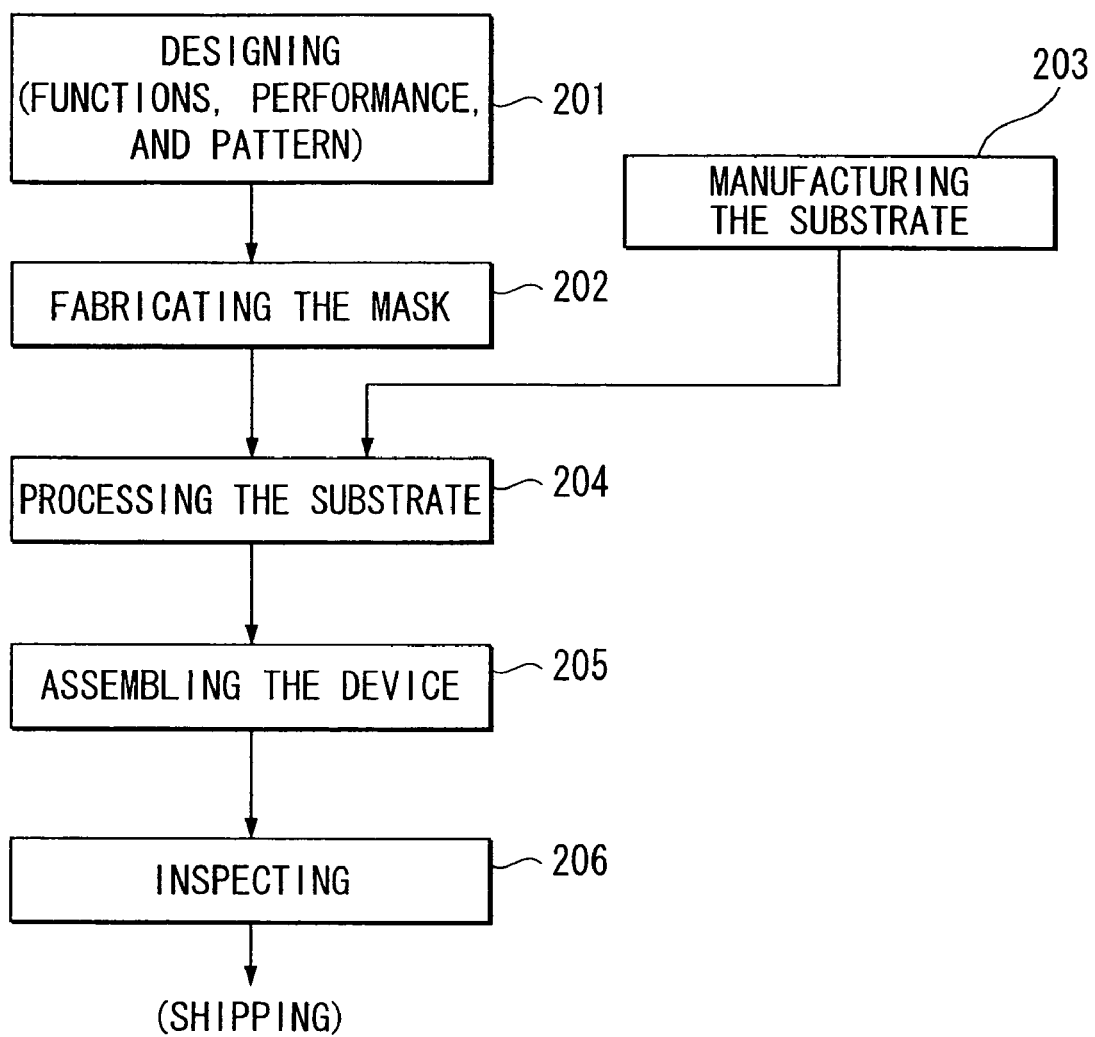
FIG. 9 is a flow chart that depicts one example of a process for fabricating a microdevice.

As shown in FIG. 9, a micro-device, such as a semiconductor device, is manufactured by: a step 201 that designs the functions and performance of the micro-device; a step 202 that fabricates the mask M (i.e., a reticle) based on this designing step; a step 203 that manufactures the substrate P, which is the base material of the device; a substrate processing step 204 that comprises a substrate process (i.e., an exposing process) that includes, in accordance with the embodiments discussed above, exposing the substrate P with the exposure light EL that passes through the mask M and developing the exposed substrate P; a device assembling step 205 (which includes fabrication processes such as dicing, bonding, and packaging processes); an inspecting step 206; and the like.

Furthermore, the features of each of the embodiments discussed above can be combined as appropriate. In addition, each disclosure of every Japanese published patent application and U.S. patent related to the exposure apparatus recited in each of the embodiments, modified examples, and the like discussed above is hereby incorporated by reference in its entirety.

What is claimed is:

1. A stage apparatus, comprising:
a stage member, which has a mounting surface on which an object is mounted and moves above a planar surface;
a drive apparatus, which generates a force to move the stage member along the planar surface; and
a deforming apparatus, which deforms a shape of the mounting surface by using the force.

2. The stage apparatus according to claim 1, further comprising:
a guiding member, which supports the stage member so that the stage member moves above the planar surface in a non-contact manner; and
vacuum preloaded air pads, which are provided at the stage member,
wherein the deforming apparatus deforms the shape of the mounting surface by using the force and a preloading vacuum force of the air pads.

3. A stage apparatus comprising:
a stage member, which moves above a planar surface;
a holding member, which is provided on the stage member and has a mounting surface that supports a lower surface of a plate-like object;
a deforming apparatus, which deforms a shape of the mounting surface by using a first force and a second force, the first force being applied to a direction that intersects with the planar surface, the second force being different from the first force, the deforming apparatus deforming the shape of the mounting surface by deforming a shape of the holding member in a state in which the deforming apparatus is not in contact with an upper surface of the object supported by the mounting surface, and
a drive apparatus, which generates a driving force to move the stage member, the drive apparatus generating either one of the first force and the second force.

4. The stage apparatus according to claim 3, wherein the deforming apparatus uses a vacuum suction force for either one of the first force and the second force.

5. The stage apparatus according to claim 4, further comprising:
a guiding member, which supports the stage member so that the stage member moves above the planar surface in a non-contact manner; and
vacuum preloaded air pads, which are provided at the stage member,
wherein the deforming apparatus uses a force for moving the stage member and a preloading vacuum force of the air pads as the first and second forces.

6. The stage apparatus according to claim 3, wherein the stage member moves along the planar surface by the driving force.

7. The stage apparatus according to claim 3, wherein the drive apparatus has an actuator that generates a first driving force for moving the stage member along the planar surface and a second driving force for moving the stage member in a direction that intersects with the planar surface, and
either one of the first force and the second force is the second driving force.

8. The stage apparatus according to claim 3, wherein when the stage member moves in a prescribed region of the planar surface, the deforming apparatus deforms a shape of at least an area positioned at a predetermined region on the mounting surface.

9. The stage apparatus according to claim 3, wherein when the stage member is driven, the deforming apparatus deforms the shape of the mounting surface.

10. The stage apparatus according to claim 3, wherein the deforming apparatus adjusts an amount of deformation based on prescribed information related to the shape of the mounting surface.

11. The stage apparatus according to claim 10, wherein the prescribed information is information related to changes in the shape of the mounting surface.

12. An exposure apparatus, comprising:
a stage apparatus according to claim 3.

13. The exposure apparatus according to claim 12, further comprising:
a projection optical system that projects an exposure light; wherein
the deforming apparatus deforms the shape of the mounting surface based on information related to a projected image of the projection optical system.

14. The exposure apparatus according to claim 12, wherein the deforming apparatus corrects the shape of the mounting surface based on information related to changes in the shape of the mounting surface.

15. The exposure apparatus according to claim 12, wherein the stage apparatus is a mask stage that is capable of moving while holding a mask on which a predetermined pattern is formed.

16. The exposure apparatus according to claim 15, wherein
the mask stage comprises a mover that has a opening through which exposure light can pass, and
the deforming apparatus applies forces to both sides of the mover, which sandwich the opening.

17. The exposure apparatus according to claim 12, wherein
the stage apparatus is a substrate stage that is capable of moving while holding a substrate on which a predetermined pattern is fowled.

18. The exposure apparatus according to claim 12, wherein
the deforming apparatus corrects the shape of the mask so that the pattern is focused on an exposed surface of a substrate, which is to be exposed.

19. A device fabricating method comprising:
a lithographic process that uses an exposure apparatus according to claim 12 to expose a substrate to an exposure beam.

* * * * *